United States Patent
Behrens et al.

(10) Patent No.: US 7,374,167 B2
(45) Date of Patent: May 20, 2008

(54) METHOD AND APPARATUS FOR CONTROLLING THE VACUUM DISTRIBUTION IN AN EXPOSER FOR PRINTING ORIGINALS

(75) Inventors: Gunnar Behrens, Kiel (DE); Lars Paulsen, Hollingstedt (DE); Axel Trilk, Kiel (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 551 days.

(21) Appl. No.: 10/717,415

(22) Filed: Nov. 19, 2003

(65) Prior Publication Data
US 2005/0067776 A1     Mar. 31, 2005

(30) Foreign Application Priority Data
Sep. 15, 2003   (DE) ................ 103 42 482

(51) Int. Cl.
B65H 5/02       (2006.01)
(52) U.S. Cl. ..................... 271/276; 271/196
(58) Field of Classification Search .......... 271/276, 271/314, 196; 198/689.1, 781.06, 471.1; 101/232, 477
See application file for complete search history.

(56) References Cited

U.S. PATENT DOCUMENTS

| | | | | |
|---|---|---|---|---|
| 4,145,040 | A | * | 3/1979 | Huber ..................... 271/276 |
| 5,329,301 | A | | 7/1994 | Balzeit et al. |
| 5,383,001 | A | | 1/1995 | Bosy |
| 6,038,976 | A | * | 3/2000 | Helmstadter et al. ....... 101/410 |
| 6,561,510 | B2 | | 5/2003 | Ozaki |
| 2001/0024014 | A1 | * | 9/2001 | Ozaki ..................... 271/276 |
| 2004/0060801 | A1 | * | 4/2004 | Vogel ..................... 198/689.1 |

FOREIGN PATENT DOCUMENTS

| EP | 0 501 984 B1 | 12/1995 |
|---|---|---|
| JP | 60 010 968 A | 1/1985 |

OTHER PUBLICATIONS

WEBSTER'S II New Riverside University Dictionary, definition of "mechanical", 1984, The Riverside Publishing Company, p. 737.*

* cited by examiner

*Primary Examiner*—Patrick Mackey
*Assistant Examiner*—Thomas Morrison
(74) *Attorney, Agent, or Firm*—Laurence A. Greenberg; Werner H. Stemer; Ralph E. Locher

(57) ABSTRACT

A method and an apparatus for controlling the vacuum distribution in an exposer for recording printing originals. The recording material for the printing originals is held firmly on a supporting surface by negative pressure. The recording material being attracted by suction by a vacuum pump via suction grooves machined into the supporting surface and via suction ducts connected to the suction grooves. For opening and closing the suction ducts, valves are provided, the valves being closed by the mechanical action of force from an actuator on a piston rod and opened by the action of compressed air on a piston in the valve. For opening the valve, an outlet opening for the compressed air is integrated into the actuator. In a printing plate exposer with an exposure drum, the suction ducts and the valves are located in the exposure drum, and the actuator is located outside the exposure drum.

11 Claims, 4 Drawing Sheets

METHOD AND APPARATUS FOR CONTROLLING THE VACUUM DISTRIBUTION IN AN EXPOSER FOR PRINTING ORIGINALS

BACKGROUND OF THE INVENTION

Field of the Invention

The invention relates to the field of electronic reproduction technology and pertains to an apparatus for controlling the vacuum distribution in an exposer for recording printing originals, preferably an exposer for recording printing originals on printing plates. In order to hold the recording material for the printing originals firmly on the supporting surface during the exposure, the recording material is attracted by suction using a vacuum pump and suction holes or suction grooves which are machined into the supporting surface.

In reproduction technology, printing originals for printed pages that contain all the elements to be printed such as texts, graphics and images are produced. For color printing, a separate printing original is produced for each printing ink and contains all the elements that are printed in the respective color. For four-color printing, these are the printing inks cyan, magenta, yellow and black (CMYK). The printing originals separated in accordance with printing inks are also referred to as color separations. The printing originals are generally screened and, by using an exposer, are exposed onto films, with which printing plates for printing large editions are then produced. Alternatively, the printing originals can also be exposed directly onto printing plates in special exposure devices, or they are transferred directly as digital data to a digital printing press. There, the printing-original data is then exposed onto printing plates, for example with an exposing unit integrated into the printing press, before the printing of the edition begins immediately thereafter.

According to the current prior art, the printing originals are reproduced electronically. In this case, the images are scanned in a color scanner and stored in the form of digital data. Texts are generated with text processing programs and graphics with drawing programs. Using a layout program, the image, text and graphic elements are assembled to form a printed page. Following the separation into the printing inks, the printing originals of the printed page are then present in digital form. The data formats largely used nowadays to describe the printing originals are the page description languages PostScript and portable document format (PDF). In a first step, the PostScript or PDF data is converted in a raster image processor (RIP) into color separation values for the CMYK color separations before the recording of the printing originals. In the process, for each image point, four-color separation values are produced as tonal values in the value range from 0 to 100%. The color separation values are a measure of the color densities with which the four printing inks cyan, magenta, yellow and black have to be printed on the printing material. The color separation values can be stored, for example, as a data value with 8 bits for each image point and printing ink, with which the value range from 0% to 100% is subdivided into 256 tonal value steps.

The data from a plurality of printed pages is assembled together with the data of further elements, such as register crosses, cut marks and folding marks and print control fields, to form printing originals for a printed sheet. The printed sheet data is likewise provided as color separation values (CMYK).

Different tonal values of a color separation to be reproduced may be reproduced in the print only by surface modulation of the printing inks applied, that is to say by screening. The surface modulation of the printing inks can be carried out, for example, in accordance with a method for halftone screening, in which the various tonal value steps of the color separation data are converted into halftone dots of different size, which are disposed in a regular pattern with periodically repeating halftone cells. During the recording of the color separations on a printing plate, the halftone dots in the individual halftone cells are assembled from exposure points that are an order of magnitude smaller than the halftone dots. Conversion of the color separation values into halftone dots takes place in a second step during the further processing of the color separation data in the raster image processor, as a result of which the color separation data is converted into high-resolution binary values with only two lightness values (exposed or not exposed) which form the pattern of the modulated dot grid.

In the exposure devices which are used in electronic reproduction technology for the recording of printing originals on films or printing plates, for example a laser beam is produced by a laser diode, shaped by an optical device and focused onto the recording material and guided over the recording material point by point and line by line by a deflection system. There are also recording devices which, in order to increase the exposure speed, produce a bundle of laser beams, for example with a separate laser diode for each laser beam, and expose a plurality of image lines of the printing original simultaneously each time they sweep across the recording material. The printing originals can be exposed onto a film material, so that what are known as color separation films are produced, which are then used for the production of printing plates by a photographic copying process. Instead, the printing plates themselves can also be exposed in a plate exposer or directly in a digital printing press, into which a unit for exposing plates is integrated. The recording material can be located on a drum (external drum exposer), in a cylindrical hollow (internal drum exposer) or on a flat surface (flatbed exposer).

In the case of an external drum exposer, the material to be exposed, in the form of films or printing plates, is mounted on a drum mounted such that it can rotate. While the drum rotates, an exposure head is moved axially along the drum at a relatively short distance. The exposure head focuses one or more laser beams onto the drum surface, sweeping over the drum surface in the form of a narrow helix. In this way, during each drum revolution, one or more image lines are exposed onto the recording material.

On the exposure drum, the recording material is held by clamping devices that fix the leading edge and the trailing edge of the recording material. Frequently, by use of a vacuum device, a negative pressure is also produced under the area of the recording material, with which negative pressure the material is additionally held in order to prevent it from being lifted off the drum surface or even detached completely as a result of centrifugal forces during the rapid rotation of the exposure drum. If the material is lifted off, the exposing laser beams will be defocused. If the recording material were to be detached, the consequence would be serious damage to the exposure device. The vacuum device produces the negative pressure by extracting air from between the drum surface and the recording material with a vacuum pump via rows of suction holes or via suction grooves that are made in the drum surface. In order to keep the vacuum losses low when clamping on recording material of different-sized formats, care is expediently taken, by a vacuum distribution device, that air is extracted only via the suction holes which are covered by the recording material, and that the remaining suction holes outside the format of the recording material are isolated from the vacuum pump.

A vacuum distribution device of this type is described in European Patent EP 0 501 984 B1. The surface of the exposure drum has rows of suction holes disposed in the axial direction, which open into suction ducts. The suction ducts likewise run axially in relation to the drum axis in the wall of the exposure drum, formed as a hollow cylinder. The suction ducts are connected to a central vacuum chamber in the interior of the drum via distribution lines that run radially in relation to the drum axis and in which there are controllable valves. The valves, which are disposed circularly around the drum axis, can selectively connect the individual suction ducts to the vacuum chamber or isolate them from it. When the recording material is being clamped on, the individual rows of suction holes have vacuum applied to them successively as a function of the respective rotational angle of the exposure drum and of the instantaneous wrap of the material around the exposure drum, and in each case only the number of rows of suction holes which correspond to the circumferential length of the material currently being clamped on is connected. As a result, the vacuum losses are minimized, and crease-free clamping, in particular of large-format films, is made possible.

A further vacuum distribution device is described in U.S. Pat. No. 5,383,001. Machined into the surface of the exposure drum is a plurality of systems of suction grooves that, with respect to their arrangement and dimensions, are matched to different-sized film formats. By using a valve spool that can be rotated in a bush, one or more suction groove systems are connected to the vacuum pump, depending on the rotational angle of the valve spool.

U.S. Pat. No. 6,561,510 describes a system in which a plurality of suction grooves running in the circumferential direction are machined into the surface of the exposure drum and, in the region of the clamping device for the leading edge of the recording material, are connected to the vacuum pump via a suction hole in each case. Integrated into the clamping device are valve plugs which, as the edge of the material is being clamped firmly, close off the suction holes where no recording material covers the corresponding suction grooves, and leave them open where the recording material covers the suction grooves.

The known devices are structurally complicated and to some extent entail high costs and high expenditure on maintenance, or they still exhibit residual vacuum losses.

SUMMARY OF THE INVENTION

It is accordingly an object of the invention to provide a method and an apparatus for controlling the vacuum distribution in an exposer for printing originals that overcome the above-mentioned disadvantages of the prior art devices and methods of this general type, which specifies a secure and reliable method and an apparatus for controlling the vacuum distribution in a exposer for recording printing originals in which the recording material is fixed by negative pressure during the recording.

With the foregoing and other objects in view there is provided, in accordance with the invention, a method for controlling vacuum distribution in an exposer for recording printing originals. The method includes holding firmly a recording material of a printing original on a supporting surface by vacuum. The recording material being attracted by suction by a vacuum pump through suction grooves machined into the supporting surface and through suction ducts connected to the suction grooves. The suction ducts are opened and closed by manipulating valves, the valves are closed by a mechanical action of force from an actuator, and the valves are opened by an action of compressed air on a piston in each of the valves.

The object is achieved by an apparatus which, uses simple valves, connects individual suction ducts and suction grooves connected thereto to the vacuum pump or isolates them therefrom. In the application of the invention in an external drum exposer, the valves are integrated into the exposure drum and are actuated by an actuator that is located outside the exposure drum.

In accordance with an added mode of the invention, there is the step of opening all of the valves simultaneously.

In accordance with another mode of the invention, there is the step of integrating an outlet opening for the compressed air into the actuator.

In accordance with a further mode of the invention, there are the steps of disposing the suction ducts and the valves in an exposure drum, and disposing the actuator outside the exposure drum.

With the foregoing and other objects in view there is provided, in accordance with the invention, an apparatus for controlling vacuum distribution in an exposer for recording printing originals. The apparatus contains a supporting surface for receiving a recording material of a printing original. The supporting surface has suction grooves machined therein and through the suction grooves the recording material is attracted to the supporting surface by suction. Suction ducts are connected to the suction grooves. Valves are provided for opening and closing the suction ducts. An actuator is provided for closing the valves by a mechanical action of force. A piston is disposed in the valves and through the piston, the valves are opened by an action of compressed air.

In accordance with an added feature of the invention, each of the valves contains a bush having a wall with drilled holes formed therein, and a piston rod connected to the piston, the piston rod being displaced in the bush.

In accordance with another feature of the invention, the piston rod closes and opens the drilled holes.

In accordance with an additional feature of the invention, the actuator closes a respective one of the valves by an action of force on the piston rod.

In accordance with a further feature of the invention, the actuator has an outlet opening formed therein for channeling the compressed air.

In accordance with another added feature of the invention, a valve block is provided and has a negative-pressure duct and a compressed-air duct formed therein. The valves are connected to the negative-pressure duct and the compressed-air duct.

In accordance with a concomitant feature of the invention, the exposer records on printing plates.

Other features which are considered as characteristic for the invention are set forth in the appended claims.

Although the invention is illustrated and described herein as embodied in a method and an apparatus for controlling the vacuum distribution in an exposer for printing originals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention will be described as a preferred embodiment using the example of an external drum exposer. However, it can likewise be used in an internal drum exposer or in a flatbed exposer.

Figure 1:
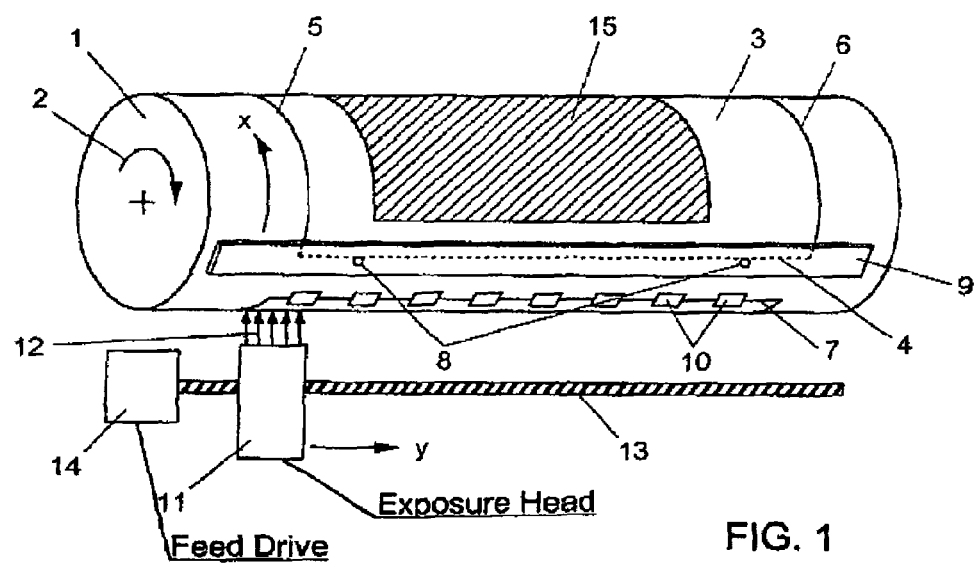
FIG. 1 is a diagrammatic, perspective view of an external drum exposer.

Referring now to the figures of the drawing in detail and first, particularly, to FIG. 1 thereof, there is shown the basic construction of an external drum exposer. An exposure drum 1 is mounted such that it can rotate and can be set into a uniform rotational movement in the direction of the rotation arrow 2 by a non-illustrated rotational drive. Clamped onto the exposure drum 1 is for example an unexposed, rectangular printing plate 3, which has a leading edge 4, a left-hand side edge 5, a right-hand side edge 6 and a trailing edge 7. The printing plate 3 is clamped on in such a way that its leading edge 4 touches contact pins 8 which are firmly connected to the exposure drum 1 and project beyond the surface of the exposure drum 1. A clamping strip 9 presses the leading edge 4 firmly on to the surface of the exposure drum 1 as well and, as a result, fixes the leading edge 4 of the printing plate 3. The printing plate 3 is held flat on the drum surface by a vacuum device 64, which attracts the printing plate 3 by suction through suction grooves in the drum surface, in order that the printing plate 3 is not detached by centrifugal forces during the rotation. Additionally, the trailing edge 7 of the printing plate 3 is fixed by clamping pieces 10.

An exposure head 11 is moved axially along the exposure drum 1 at a relatively short distance as the exposure drum 1 rotates. The exposure head 11 focuses one or more laser beams 12 onto the drum surface, which sweep over the drum surface in the form of narrow helices. In this way, during each drum revolution, one or more image lines are exposed onto the recording material in the circumferential direction x. The exposure head 11 is moved in the feed direction y by a feed spindle 13, to which it is connected by a form fit and which is set moving rotationally by a feed drive 14. The printing original 15 exposed in this way on the printing plate 3 generally covers only part of the recording area available.

Figure 2:
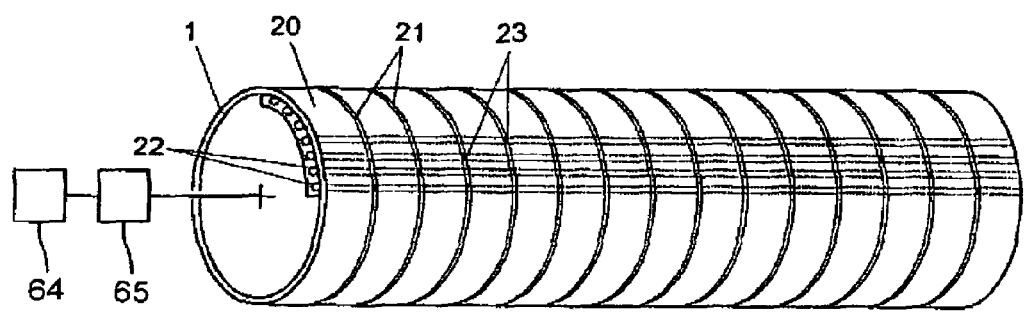
FIG. 2 is a perspective view of the exposure drum with suction grooves and suction ducts.

FIG. 2 shows a preferred configuration of suction grooves 21 that are machined into the drum surface 20 and run in the circumferential direction of the exposure drum 1. The exposure drum 1 is configured as a hollow cylinder. Machined over part of the inner surface of the hollow cylinder are suction ducts 22, which run in the axial direction of the exposure drum 1. For some of the suction ducts 22, their course in the interior of the exposure drum 1 is shown. The suction grooves 21 in the drum surface 20 are connected to the suction ducts 22 via drilled holes 23.

Figure 3:
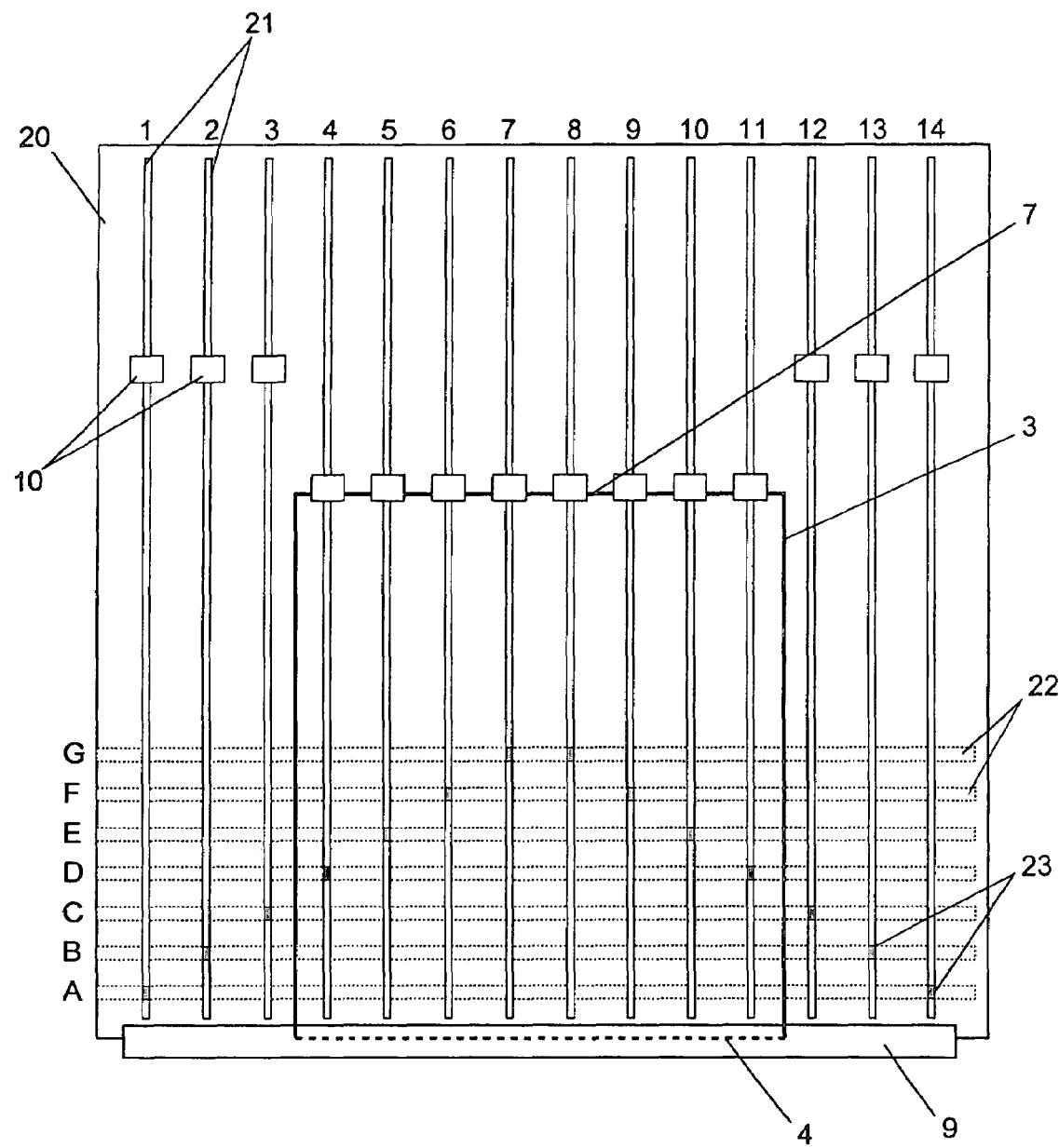
FIG. 3 is an illustration showing a configuration of suction grooves and suction ducts.

By using FIG. 3, which shows the unwound drum surface 20, it will be explained how the negative pressure is limited to the area underneath the printing plate 3 to be exposed. In the example of FIG. 3, 14 suction grooves 21 are shown, which are numbered from 1 to 14. In each case two suction grooves 21 are connected to a suction duct 22 by the drilled holes 23, so that there are seven suction ducts 22, which are designated with A to G. The number of suction grooves 21 can be selected as desired, however, depending on the size of the drum surface 20 and depending on the magnitude of the centrifugal force which is exerted by the drum rotation on the printing plate 3 to be attracted by suction. It is also possible for each suction groove 21 to be assigned a separate suction duct 22, or for more than two suction grooves 21 to be connected to a suction duct 22 in each case via the drilled holes 23. The suction grooves 21 begin in the vicinity of the clamping strip 9 for the leading edge 4 of the printing plate 3 and end on the opposite side of the clamping strip 9, that is to say they do not run continuously over the entire circumference of the exposure drum. The trailing edge 7 of the printing plate 3 is fixed by the clamping pieces 10. The clamping pieces 10 are displaceable in the suction grooves 21 and are configured such that they seal off the suction grooves 21 simultaneously and in this way limit the negative pressure in the suction grooves 21 in the circumferential direction of the drum surface 20 to the area underneath the printing plate 3. In the axial direction of the drum surface 20, the negative pressure is limited by only the suction ducts 22 whose drilled holes 23 lie underneath the printing plate 3 being connected to the vacuum pump. In the example of FIG. 3, these are the suction ducts D, E, F, G, as a result of which the suction grooves 4 . . . 11 are supplied with negative pressure. The suction grooves 1 . . . 3 and 12 . . . 14 are then not connected to the vacuum pump and, as a result, cannot reduce the negative pressure for holding the printing plate 3 as a result of vacuum losses.

Figure 4:
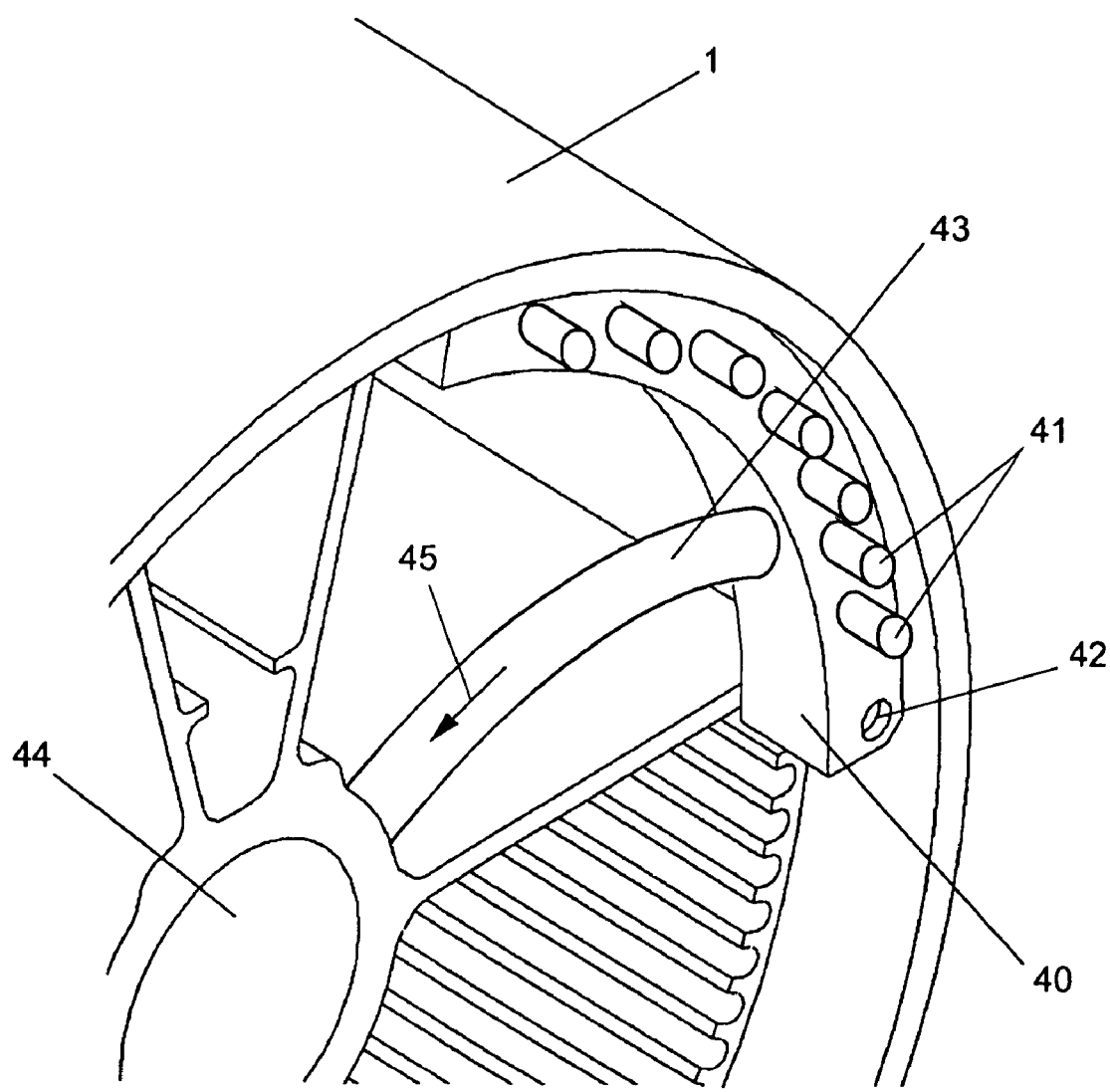
FIG. 4 is a perspective, partial view of a valve block for controlling the suction ducts.

FIG. 4 shows a partial view of the end of the exposure drum 1. The suction ducts 22, which are not visible in FIG. 4, are sealed off by a valve block 40, in which, for each suction duct 22, a valve 41 is provided, with which the corresponding suction duct 22 can be connected to the vacuum pump or isolated from the vacuum pump. The valve block 40 is connected via a hose 43 to a vacuum chamber 44 in the center of the exposure drum 1, and the vacuum chamber 44 is connected to the vacuum pump 64, which is located outside the exposure drum 1 and, for example, is connected to the vacuum chamber 44 via a rotary leadthrough 65. Through the hose 43, air is extracted in the direction of arrow 45 out of the valve block 40 and therefore out of the suction ducts 22 which have been opened by the valves 41. Piston rods that can be displaced in the valves 41 project out of the valve block 40, so that they can be actuated by being pushed selectively into the valve block 40 by a non-illustrated mechanical actuator. Also provided in the valve block is a compressed-air opening 42, via which all the valves 41 can be forced out of the valve block 40 again by a compressed-air surge.

Figure 5:
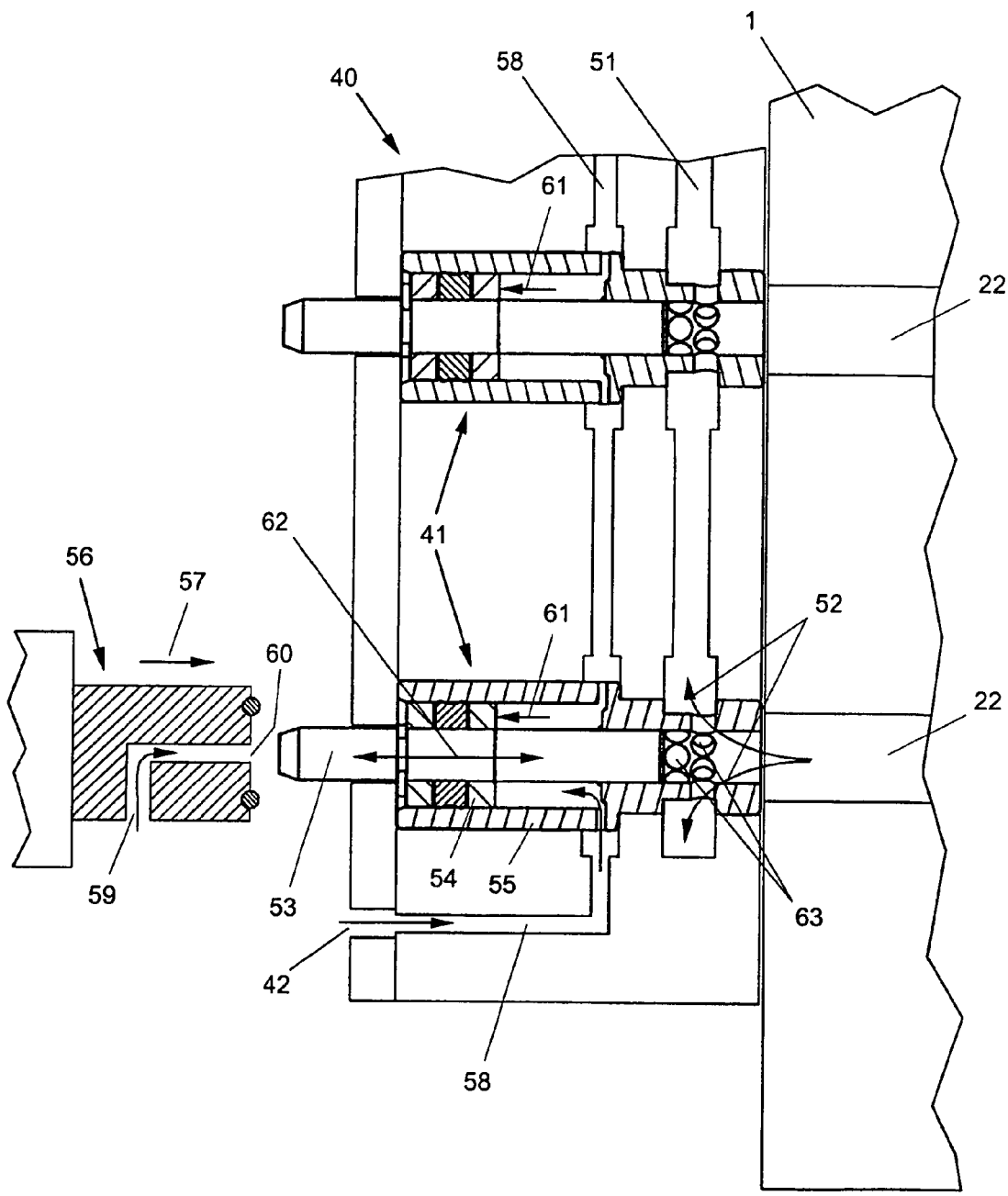
FIG. 5 is a sectional view of the valve block with valves and an actuator for actuating the valves.

FIG. 5 shows the structure and the mode of action of the valves 41, and the principle of their actuation, in a schematic cross-sectional view. The valve block 40 is connected to the exposure drum 1 in such a way that in each case a valve 41 is opposite each suction duct 22. In the valve block 40 there runs a negative-pressure duct 51, which connects all the valves 41 and is connected to the vacuum pump via the hose 43 and the vacuum chamber 44. The two valves 41 shown in FIG. 5 are illustrated in the opened state, in which air is sucked in the direction of arrows 52 out of the suction duct 22 into the negative-pressure duct 51. The valve 41 contains a piston rod 53 and a piston 54 that is connected thereto, which can be displaced in a bush 55 in the directions of double-headed arrow 62. In the region of the negative-pressure duct 51, the wall of the bush 55 is provided with drilled holes 63, so that the air can pass from the suction duct 22 into the negative-pressure duct 51. When the valve 41 is open, the piston rod 53 opens the drilled holes 63 of the bush 55. Starting from the opened state of all the valves 41, individual valves 41 are closed selectively, by a mechanical actuator 56, which is fitted outside the exposure drum 1, forcing the piston rod 53 into the valve block 40 in the direction of arrow 57. When the valve 41 is closed, the piston rod 53 closes the drilled holes 63, so that the suction duct 22 is isolated from the vacuum pump. In order to close the valve 41, the exposure drum 1 is brought into an angular position in which the valve 41 to be actuated is opposite the actuator 56. The actuator 56 can be actuated, for example, by a motor drive or by an electromagnetic device. Pneumatically or hydraulically acting drives are likewise possible.

When all the valves 41 are to be opened again, the actuator 56 is placed on the compressed-air opening 42. The compressed-air opening 42 opens into a compressed-air duct 58 that, within the valve block 40, likewise connects all the valves 41. Integrated into the actuator 56 is a compressed-air feed 59, which opens into an outlet opening 60 at the end of the actuator 56. When the actuator 56 is put in place, compressed air is blown into the compressed-air duct 58, with which the pistons 54 of all the valves 41 are moved in the direction of the arrows 61, as a result of which all the valves 41 are opened simultaneously.

We claim:

1. A method for controlling vacuum distribution in an exposer for recording printing originals, which comprises the steps of:
    holding firmly a recording material of a printing original on a supporting surface by vacuum, the recording material being attracted by suction by a vacuum pump through suction grooves machined into the supporting surface and through suction ducts connected to the suction grooves; and
    opening and closing the suction ducts by manipulating valves each having a respective piston rod and a piston, the valves being closed by a force from a mechanical actuator applied by the mechanical actuator physically contacting the respective piston rod, and the valves being opened by an action of compressed air on the piston in each of the valves.

2. The method according to claim 1, which further comprises opening all of the valves simultaneously.

3. The method according to claim 1, which further comprises integrating an outlet opening for the compressed air into the actuator.

4. The method according to claim 1, which further comprises:
    disposing the suction ducts and the valves in an exposure drum; and
    disposing the actuator outside the exposure drum.

5. The method according to claim 1, wherein the exposer records on printing plates.

6. An apparatus for controlling vacuum distribution in an exposer for recording printing originals, comprising:
    a supporting surface for receiving a recording material of a printing original, said supporting surface having suction grooves machined therein and through said suction grooves the
    recording material is attracted to said supporting surface by suction;
    suction ducts connected to said suction grooves;
    valves disposed in a valve block, said valves for opening and closing said suction ducts, each of said valves having a respective piston rod and a respective piston, said valves being opened by compressed air acting on said pistons; and
    a mechanical actuator for closing said valves with a force applied by said mechanical actuator physically contacting said respective piston rod.

7. The apparatus according to claim 6, wherein said valves each contain:
    a bush having a wall with drilled holes formed therein, said piston rod being displaced in said bush.

8. The apparatus according to claim 7, wherein said piston rod closes and opens said drilled holes.

9. The apparatus according to claim 6, wherein said mechanical actuator has an outlet opening formed therein for channeling the compressed air.

10. The apparatus according to claim 6, wherein said valve block has a negative-pressure duct and a compressed-air duct formed therein, said valves connected to said negative-pressure duct and said compressed-air duct.

11. The apparatus according to claim 6, wherein the exposer records on printing plates.

\* \* \* \* \*